United States Patent [19]

Fujita

[11] Patent Number: 5,250,912

[45] Date of Patent: Oct. 5, 1993

[54] RF POWER AMPLIFIER

[75] Inventor: Noriyuki Fujita, Tokyo, Japan

[73] Assignee: NEC Corporation, Japan

[21] Appl. No.: 891,416

[22] Filed: May 29, 1992

[30] Foreign Application Priority Data

May 30, 1991 [JP] Japan .................. 3-155869

[51] Int. Cl.⁵ .............................. H03G 3/30
[52] U.S. Cl. .................. 330/285; 330/277;
                                330/297; 375/71
[58] Field of Search ........ 330/277, 285, 297;
                           375/71, 73; 455/89, 116, 127

[56] References Cited

U.S. PATENT DOCUMENTS

| | | | |
|---|---|---|---|
| 4,500,848 | 2/1985 | Marchand et al. | 330/277 X |
| 4,510,460 | 4/1985 | Tamura | 330/285 |
| 5,051,706 | 9/1991 | Zushi | 330/277 |

FOREIGN PATENT DOCUMENTS 0078189 5/1983 European Pat. Off. .
0110355 6/1984 European Pat. Off. .

Primary Examiner—James B. Mullins
Attorney, Agent, or Firm—Ostrolenk, Faber, Gerb & Soffen

[57] ABSTRACT

A radio frequency (RF) amplifier for amplifying an RF signal with a high power efficiency and with a minimum of signal distortions by using a GaAs field effect transistor (FET). An idling current for class "A" amplification is set in the FET. An output low pass filter is connected to the drain of the FET and provided with an impedance higher than a high gain impedance, so that the FET and a load may be matched in power during high RF signal operation, i.e., the dynamic impedance of the FET and the impedance of the load may be matched. A drain bias to the FET is turned on and turned off in synchronism with the ON/OFF of the input RF signal. The amplifier, therefore, not only performs class "A" amplification with a minimum of signal distortions but also further saves power since it is turned off in the absence of a signal, thereby achieving a higher power efficiency.

13 Claims, 2 Drawing Sheets

RF POWER AMPLIFIER

BACKGROUND OF THE INVENTION

The present invention relates to a radio frequency (RF) power amplifier for amplifying an RF signal with a high power efficiency and with a minimum of distortions by use of a GaAs field effect transistor (FET) and, more particularly, to an RF power amplifier feasible for the power amplification of an ON/OFF RF signal, e.g., TDMA (Time Division Multiple Access) signal to be sent from a digital portable telephone.

It has been customary with the above-described type of RF power amplifier to use amplification, i.e., class "AB" or class "B" amplification for the purpose of enhancing the radio of RF signal output to supplied DC power, i.e., a power efficiency. Specifically, with such an RF power amplifier, it is a common practice to reduce the drain current, or idling current, of the FET to less than about one-tenth of saturation drain current (class "AB" amplification) when an RF signal is not inputted or when a small RF signal is inputted. When an RF signal of regular level is inputted to the RF power amplifier (generally during high amplitude operation), the drain current of the FET sharply increases even to a level four or five times higher than the idling current. Nevertheless, a high power efficiency is achievable since the gain and RF signal output in such a condition increase more than the drain current.

However, the problem with the RF power amplifier is that the nonlinear amplification mentioned above noticeably distorts the RF signal output due to, among others, intermodulations (particularly odd intermodulations, e.g., IM3, IM5 and IM7). For example, when a digital signal modulated by QPSK (Quadrature Phase-Shift Keying) is applied to the RF power amplifier, the distortion of the RF signal output is, when evaluated in terms of nearby channel leak power, found to increase beyond a limit regarding the specifications of a system using the QPSK modulated wave.

In this connection, one of conventional RF power amplifiers of the type performing class "AB" amplification with an FET uses a module FM C090902 (manufactured by Fujitsu Ltd., Kawasaki, Japan) and applied a voltage of 5.8 V to between the drain and the source of the FET to thereby cause an idling current of 150 mA to flow. When an RF signal of 950 MHz and +3 dBm is inputted to such a power amplifier, an RF signal output of +32 dBm (gain of 29 dB) and an FET drain current of 600 mA are obtained, insuring a satisfactory power efficiency. However, the 50 kHz nearby channel leak power of this module is as great as 35 dB in terms of RF signal output ratio.

SUMMARY OF THE INVENTION

It is therefore an object of the present invention to provide an RF power amplifier which reduces intermodulation distortion ascribable to class "AB" or class "B" amplification, specifically an RF power amplifier capable of amplifying an RF signal with a higher power efficiency and with a minimum of signal distortions by use of an FET.

It is another object of the present invention to provide an RF power amplifier suitable for the power amplification of a TDMA signal or similar ON/OFF RF signal.

An RF power amplifier of the present invention has a power amplifier unit for amplifying an RF signal from an RF signal source by an FET included therein and delivering the amplified RF signal to a load, and a drain bias control circuit for turning on and turning off a drain bias to the FET in synchronism with the turn-on and turn-off of the RF signal. The power amplifier unit includes an input low pass filter (LPF) connected to the gate electrode of the FET and an output LPF connected to the drain electrode of the FET. The LPFs each matches the FET and the RF signal source or the FET and the load with respect to impedance and power. The power amplifier unit includes a drain bias circuit for applying a drain bias to the drain electrode of the FET, and a gate bias circuit for applying a gate bias to the gate electrode of the FET. The input terminal of the drain bias circuit is connected to the output terminal of the drain bias control circuit.

In the RF power amplifier unit, an idling current for class "A" amplification flows through the FET. The power amplifier unit substantially matches the dynamic impedance Zd of the FET and the load impedance Zl by the output LPF when a regular RF signal is outputted (i.e. assuming that the impedance of the output LPF is Zf, $Zf^2 \approx Zd \cdot Zl$ is set up). Specifically, the power amplifier unit sets the output LPF impedance Zf such that substantially the maximum power is applied from the FET to the load when a regular RF signal is outputted, i.e., such that the FET and the load are matched in power. Let the output LPF impedance Zf satisfying the above-mentioned power matching condition be referred to as a power matching impedance Zm herein. Generally, the dynamic impedance of an FET increases with the increase in RF signal input level. Therefore, the output LPF impedance Zf is made higher than an impedance which will give substantially maximum gain during low RF signal level operation (referred to as a high gain impedance Zg hereinafter) and set at the power matching impedance Zm. Then, since the output LPF impedance Zm is higher than the high gain impedance Zg, the drain current of the FET when a regular RF signal is outputted is smaller than when the output LPF impedance Zf is set at the high gain impedance Zg. The RF power amplifier, therefore, achieves a high power efficiency in the event of regular RF signal output despite the class "A" amplification which distorts signals little.

In the event of amplifying a TDMA signal or similar ON/OFF RF signal, the RF power amplifier turns on and turns off the drain bias to the FET in synchronism with the turn-on and turn-off of the RF signal. The amplifier, therefore, prevents the drain current from appearing in the FET when the RF signal is in an OFF state, thereby saving power. Moreover, the amplifier frees the RF signal output from noticeable distortions and is, therefore, feasible for the power amplification of, among others, a TDMA signal or similar digital RF signal which occurs in bursts with a constant level.

The power amplifier unit may be provided on a thick film substrate in a hybrid integrated circuit (IC) configuration to reduce the size of the RF power amplifier. If the input and output LPFs are each implemented by chip capacitors and inductors of a distributed constant circuit, the scattering between them will be reduced to facilitate the fabrication of the RF power amplifier.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENT

Figure 1:
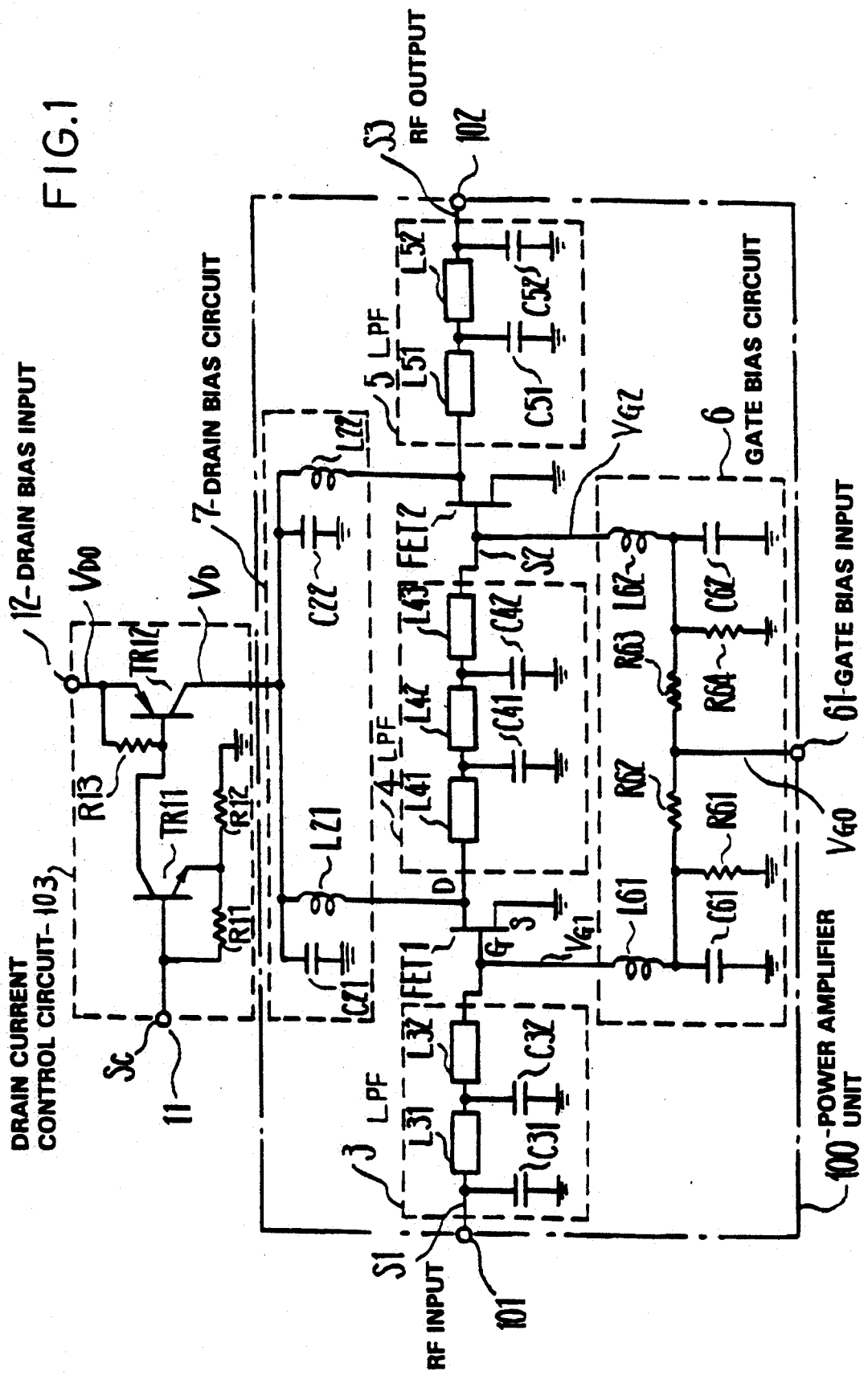
FIG. 1 is a circuit diagram representative of an RF power amplifier embodying the present invention.

Referring to FIG. 1 of the drawings, an RF power amplifier embodying the present invention is shown and includes a power amplifier unit 100 implemented as a thick film hybrid IC. The power amplifier unit 100 has an RF signal input terminal 101 to which an RF signal S1 is applied from an RF signal source, not shown. FETs 1 and 2 amplify the input RF signal S1 to feed the resulting RF signal output S3 to a load, not shown, via an RF signal output terminal 102. It is to be noted that the input RF signal S1 may be a TDMA signal undergone QPSK modulation, and that the impedances Za and Zl of the RS signal source and the load, respectively, are usually 50 Ω. A drain current control circuit 103 selectively turns on or turns off a drain voltage $V_{DD}$ from a drain bias input terminal 12 by a switch circuit; in an ON state, the control circuit 103 feeds a drain bias $V_D$ to a drain bias circuit 7 included in the power amplifier unit 100 via the output terminal thereof. Specifically, the drain current control circuit 103 receives a control signal Sc synchronous with the ON/OFF of the input RF signal S1 via a control signal input terminal 11 thereof and, in turn, controls the switch circuit by the control signal Sc to turn on and turn off the supply of the drain bias $V_D$ to the drain bias circuit 7.

In the power amplifier unit 100, an input LPF 3 is disposed between the RF signal input terminal 101 and the gate electrode of the FET 1 in order to set up impedance matching between the RF signal source and the FET 1. An interstage LPF 4 is connected between the drain electrode of the FET 1 and the gate electrode of the FET 2. This LPF 4 plays the role of an impedance matching circuit for the FETs 1 and 2 and the role of gain matching circuit for increasing the gain of the FETs 1 and 2 at the same time. An output LPF 5 is connected between the drain electrode of the FET 2 and the RF signal output terminal 102 for matching the dynamic impedance Zd of the FET 2 associated with the output RF signal S3 of regular level and the load impedance Zl, i.e., matching the FET 2 and the load with respect to power. The drain bias circuit 7 delivers the drain bias $V_D$ fed from the output terminal of the drain bias control circuit 103 to the drain electrodes of the FETs 1 and 2. A gate bias circuit 6 receives a gate voltage $V_{G0}$ applied to a gate bias input terminal 61 and, in turn, generates gate biases $V_{G1}$ and $V_{G2}$ for the FETs 1 and 2, respectively. The gate biases $V_{G1}$ and $V_{G2}$ are applied to the gate electrodes of the FETs 1 and 2, respectively.

In detail, the input LPF 3 has a cut-off frequency far higher than the frequency of the input RF signal S1 and is made up of inductors L31 and L32 of a distributed constant circuit, and chip type capacitors C31 and C32. The distributed constant circuit is constituted by a 50 Ω line shorter than the wavelength of the input RF signal S1. Preferably, the impedance Zf1 of the LPF 3 should be set such that the impedance Zs of the RF signal source and the input impedance Zi2 of the FET 1 match at the regular input level of the input RF signal S1.

The LPF 5 also has a cut-off frequency far higher than the frequency of the input RF signal S1. The LPF 5 has inductors L51 and L52 of a distributed constant circuit, and chip type capacitors C51 and C52; the distributed constant circuit is implemented by a 50 Ω line shorter than the wavelength of the input RF signal S1. The impedance Zf3 of the LPF 5 is selected to be nearly equal to $(Zd.Zl)^{\frac{1}{2}}$ so as to increase the power efficiency of the FET 2, i.e., to match the FET 2 and the load in power at the regular output level of the output RF signal S3 and within a range which does not aggravate the signal distortion of the RF signal S3.

The interstage LPF 4, like the above-stated LPFs, has a cut-off frequency far higher than the frequency of the input RF signal S1 and is constituted by inductors L41, L42 and L43 of a distributed constant circuit, and chip type capacitors C41 and C42. The distributed constant circuit is implemented by a 50 Ω line shorter than the wavelength of the input RF signal S1. The impedance setting condition of this LPF 4 is intermediate between the impedance setting conditions of the LPFs 3 and 5. However, since the level of the output RF signal of the FET 1 (input RF signal of the FET 2) is far lower than that of the output RF signal S3, the impedance Zf3 of the interstage LPF 4 should preferably be so set as to increase the gain of the RF signals S1 and S2 while reducing signal distortions.

The drain bias circuit 7 delivers the drain voltage $V_D$ from the output of the drain current control circuit 103 to the drain electrode of the FET 1 via the inductor L21 and to the drain electrode of the FET 2 via the inductor L22. The chip type capacitor C21 and inductor L21 and the chip type capacitor C22 and inductor L22 respectively cooperate to prevent the RF signals S2 and S3 from leaking from the power amplifier unit 100 to external circuitry including the drain current control circuit 103.

The gate bias circuit 6 divides the gate voltage $V_{G0}$ from the gate bias input terminal 61 by resistors R61 and R62 and thereby feeds an adequate gate bias $V_{G1}$ to the gate electrode of the FET 1 via an inductor L61. At the same time, the circuit 6 divides the gate voltage $V_{G0}$ by resistors R63 and R64 to apply an adequate gate bias $V_{G2}$ to the gate electrode of the FET 2 via an inductor L62. The inductors L61 and L62 respectively cooperate with chip type capacitors C61 and C62 to prevent the RF signals S1 and S2 from leaking from the power amplifier unit 100 to the external circuitry.

The drain current control circuit 103 passes the drain voltage $V_{DD}$ from the drain bias input terminal 12 through a switching bipolar transistor TR12 and then feeds the drain bias $V_D$ to the drain bias circuit 7 via the output terminal thereof (collector electrode of the transistor TR12). The ON/OFF signal (control signal) Sc from the control signal input terminal 11 is applied to the base electrode of a control bipolar transistor TR11 while a signal responsive to the signal Sc is applied to the base electrode of the transistor TR12 to thereby switch on or switch off the transistor TR12. As a result, the supply of the drain bias $V_D$ to the drain bias circuit 7 is set up or interrupted under the control of the control signal Sc. Resistors R11 and R12 respectively set biases for the base electrode and the emitter electrode of the transistor TR11. Likewise, a resistor R13 sets a bias for the base electrode of the transistor TR12.

Figure 2:
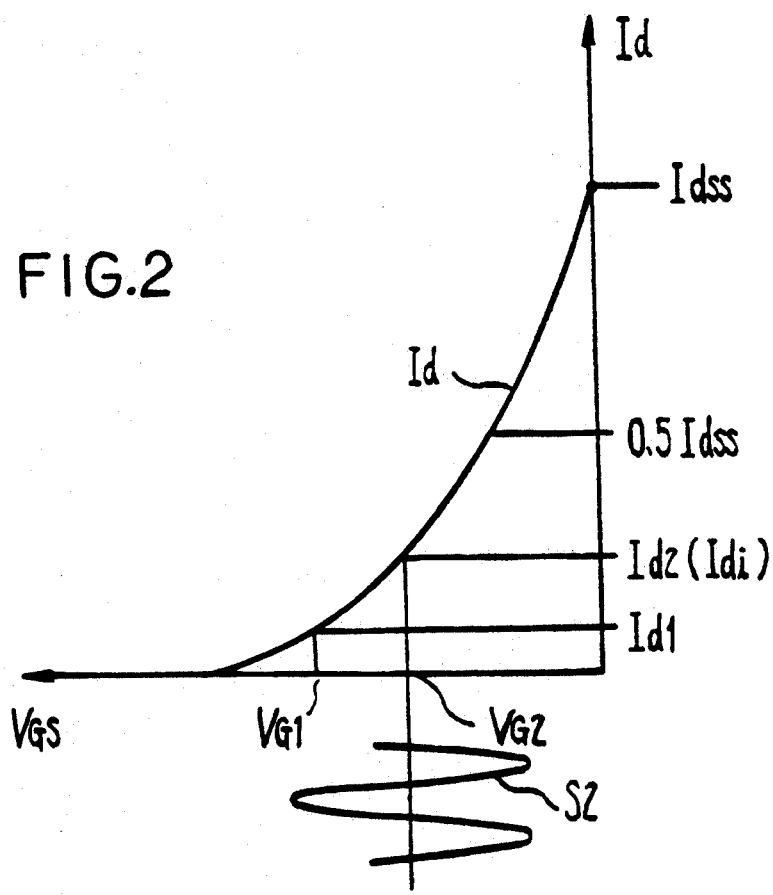
FIG. 2 is a graph indicative of the static characteristic of an FET included in the embodiment.

The operation and circuit constant setting of the power amplifier unit 100, particularly the FET 2 and output LPF 5, will be described with reference also made to FIG. 2.

To begin with, to set an idling current Idi which causes the FET 2 to perform class "A" amplification, the drain bias circuit 7 and the gate bias circuit 6 respectively set the drain bias $V_D$ and the gate bias $V_{G2}$ in the FET 2. Assuming that the saturation drain current of the FET 2 is Idss, then the idling current Idi during class "A" amplification (i.e. drain current Id2) lies in the range of 0.2 Idss to 0.6 Idss. When it is desired to increase the power efficiency of the power amplifier unit 100, the drain current Id2 is set at the power limit, i.e., about 0.2 Idss. The gate bias $V_G$ during class "AB" amplification is $V_{G1}$ which is deeper than the gate bias $V_{G2}$ assigned to class "A" amplification, so that the idling current Idi (drain current Id1) is reduced to about 0.1 Idss. The idling current Id1 which minimizes the signal distoration is about 0.5 Idss. The impedances Zf2 and Zf3 of the interstage LPF 4 and output LPF 5 are respectively set at high gain impedances Zg2 and Zg3 beforehand, so that in the initial stage of circuit constant setting the FETs 1 and 2 may each generate substantially the maximum gain in response to a small input RF signal.

Next, the input RF signal S1 is applied to the RF signal input terminal 101, i.e., the RF signal S2 is applied to the gate electrode of the FET 2. As a result, the output RF signal S3 of regular level appears on the RF signal output terminal 102. At this instant, the drain current Id of the FET 2 is substantially the same as that of an FET of class "AB" amplification. The impedance Zf3 of the output LPF 5 is adjusted such that the drain current Id of the FET 2 decreases with the regular output level being maintained. Specifically, since the dynamic impedance of the FET 2 increases with the increase in the level of the RF signal S2 coupled to the gate electrode thereof, to adjust the circuit constant of the output LPF 5 in a direction for reducing the drain current of the FET 2 means to increase the impedance Zf3 of the LPF 5 to above the previously mentioned high gain impedance Zg3. As the impedance Zf3 increases to the power matching impedance Zm nearly equal to $(Zd \cdot Z1)^{\frac{1}{2}}$, the power amplifier unit 100 achieves substantially the maximum output level despite that the drain current Id of the FET 2 is smaller than when the impedance Zf3 of the output LPF 5 is set at the high gain impedance Zg. Conversely, when the impedance Zf3 of the output LPF 5 is set at the power matching impedance Zm, the output RF signal S3 will have the same level as the level corresponding to the high gain impedance Zg3 even when the drain current Id is lowered to below 90%. It is noteworthy that the distortion of the output RF signal S3 remains the same as when the high gain impedance Zg3 is set, since the class "A" amplification bias is not set on the drain electrode or the gate electrode of the FET 2.

As stated above, with the power amplifier unit 100, it is possible to set up a high power efficiency by selecting the impedance Zf3 of the output LPF 5 higher than the high gain impedance Zg3. In addition, class "A" amplification is not degraded despite a low drain current Id, freeing the output RF signal S3 from distortions.

In the power amplifier unit 100, the FETs 1 and 2 may respectively be implemented by NE800196 (manufactured by NEC Corp., Tokyo, Japan; Idss of 300 mA) and N1069L-4B (also manufactured by NEC Corp.; Idss of 3A), and a drain voltage $V_D$ of 5.8 V can be applied to the drain electrodes of the FETs 1 and 2. In such a power amplifier unit 100, when the impedance Zf3 of the output LPF 5 was set at the high gain impedance Zg3 and an RF signal S1 of 960 MHz was inputted, an output RF signal S3 of 32 dBm, a total drain current of 618 mA (about 0.19 Idss) of the FETs 1 and 2, a gain of 28 dB, and 50 kHz nearby channel leak power of −48.5 dB were obtained. On the other hand, when the impedance Zf3 of the output LPF 5 was set at the power matching impedance Zm, the total drain current, the gain and the 50 kHz nearby channel leak power were respectively measured to be 566 mA, 27 dB and −49.3 dB on the assumption that the output RF signal S3 had the level of 32 dBm as in the above-mentioned case. In this way, for the same nonlinear distortion, the power amplifier unit 100 whose output LPF 5 has the impedance Zf3 thereof set at the power matching impedance Zm reduces the total drain current to about 90% of the drain current associated with the high gain impedance Zg3. In the power amplifier unit 100, the idling current Idi is much greater than in the previously stated conventional class "AB" power amplifier. However, when the unit 100 is turned on in response to a regular RF signal S1, the power consumption remain substantially the same (decreases by about 6%) while the 50 kHz nearby channel leak power is reduced by more than 10 dB.

Figure 3:
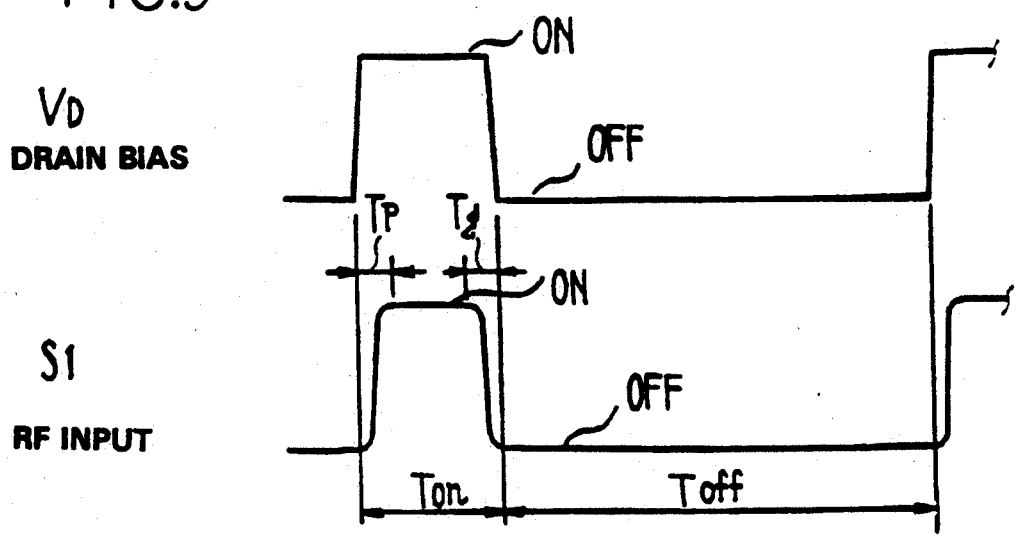
FIG. 3 shows the waveforms of an input RF signal S1 and a drain bias $V_D$ particular to the embodiment.

Referring also to FIG. 3, the input RF signal S1 appearing on the RF signal input terminal 101 is a TDMA signal having an ON period Ton and an OFF period Toff which are respectively one-third and two-third of the entire signal period. The ON period has a preamble signal period Tp at the beginning and a guard period Tg at the end. The control signal Sc synchronous with the input RF signal S1 is applied to the control signal input terminal 11. In response, the gate current control circuit 103 turns off or turns on the drain bias $V_D$ to the drain bias circuit 7. The turn-on and turn-off of the drain bias $V_D$ occur in the preamble signal period Tp and guard period of the input RF signal S1. The power amplifier unit 100 maintains the normal RF signal output S3 throughout the data signal period except for the periods Tp and Tg. It follows that the power amplifier unit 100 is turned on and turned off in synchronism with the turn-on and turn-off of the RF signal S1 and, therefore, achieves a power efficiency even higher than that of a continuously operating class "AB" power amplifier. Moreover, the unit 100 is feasible for the power amplification of a TDMA signal since it operates only in the class "A" amplification mode which scarcely distorts signals.

In summary, in accordance with the present invention, the RF power amplifier causes the FETs 1 and 2 to operate in the class "A" amplification mode and selectively turns on or turns off the drain bias $V_D$ to the FETs 1 and 2 in synchronism with the input RF signal. Hence, when an RF signal of regular level is inputted to the RF power amplifier, the amplifier achieves a high power efficiency and allows a minimum of nonlinear distortions, particularly intermodulation distortion, to occur. It follows that when the RF power amplifier is used to amplify the power of, for example, a TDMA signal undergone QPSK modulation, it not only enhances the power efficiency, compared to a conventional RF power amplifier, but also reduces the nearby channel leak power by more than 10 dB.

Although the invention has been described with reference to the specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A radio frequency (RF) power amplifier comprising:
   a field effect transistor (FET) for amplifying an RF signal applied to a gate electrode thereof to thereby output an amplified RF signal via a drain electrode thereof;
   drain bias applying means for applying a drain bias to said drain electrode of said FET;
   gate bias applying means for applying a gate bias to said gate electrode of said FET, said drain bias applying means and said gate bias applying means setting an idling current for class "A" amplification in said FET;
   an output low pass filter (LPF) disposed between an RF signal output terminal to which a load is connected and said drain electrode for matching said FET and said load with respect to power, said output LPF having an impedance higher than an impedance which gives said RF power amplifier substantially the maximum gain when said RF power amplifier produces a regular output; and
   bias application control means for turning on and turning off the application of the drain bias to said drain bias applying means in synchronism with the turn-on and turn-off of the RF signal.

2. An RF power amplifier as claimed in claim 1, wherein the impedance of said output LPF is set at a value which substantially matches the dynamic impedance of said FET and the impedance of said load when said RF power amplifier produces a regular output.

3. An RF power amplifier as claimed in claim 1, further comprising an input LPF interposed between an RF signal input terminal to which an RF signal source for supplying the RF signal is connected and said gate electrode of said FET for setting up impedance matching between said FET and said RF signal source.

4. An RF power amplifier as claimed in claim 3, wherein said output LPF and said input LPF each comprises chip type capacitors and inductors of a circuit.

5. An RF power amplifier as claimed in claim 4, wherein said circuit is a distributed constant circuit.

6. An RF power amplifier as claimed in claim 3, wherein said FET, said drain bias applying means, said gate bias applying means, said output LPF and said input LPF are formed on a thick film substrate.

7. An RF power amplifier as claimed in claim 3, wherein said RF power amplifier further comprises at least a second FET, cascaded with said above-mentioned FET, for further amplifying said amplified RF signal outputted by said above-mentioned FET; said amplified RF signal being applied to a gate electrode of said second FET to be outputted as a further amplified RF signal from a drain electrode of said second FET;
   said drain bias applying means applying a drain bias to the drain electrode of each of said FETs;
   said gate bias applying means applying a gate bias to the gate electrode of each of said FETs;
   said input LPF being interposed between said RF signal input terminal and the gate electrode of said above-mentioned FET;
   said output LPF being interposed between said RF signal output terminal and the drain electrode of said second FET; and
   said RF power amplifier further comprising at least one interstage LPF disposed between the drain electrode of said above-mentioned FET and the gate electrode of said second FET for matching said FETs with respect to gain.

8. An RF power amplifier as claimed in claim 7, wherein said output LPF has an impedance which substantially matches the dynamic impedance of said second FET and the impedance of said load when said RF power amplifier produces a regular output.

9. An RF power amplifier as claimed in claim 7, wherein said input LPF and said output LPF each comprises chip type capacitors and inductors of a circuit.

10. An RF power amplifier as claimed in claim 9, wherein said FETs, said drain bias applying means, said gate bias applying means, said input LPF, said interstage LPF and said output LPF are formed on a thick film substrate.

11. An RF power amplifier as claimed in claim 9, wherein said circuit is a distributed constant circuit.

12. An RF power amplifier as claimed in claim 1, wherein the RF signal comprises a TDMA (Time Division Multiple Access) signal.

13. An RF power amplifier as claimed in claim 1, wherein said FET comprises a GaAs FET.

* * * * *